(12) United States Patent
Kugman

(10) Patent No.: US 12,080,624 B2
(45) Date of Patent: Sep. 3, 2024

(54) APPARATUS AND METHOD FOR HOLDING A HEAT GENERATING DEVICE

(71) Applicant: Solaredge Technologies Ltd., Herzeliya (IL)

(72) Inventor: Tomer Kugman, Betar Illit (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 18/343,885

(22) Filed: Jun. 29, 2023

(65) Prior Publication Data

US 2023/0343675 A1    Oct. 26, 2023

Related U.S. Application Data

(63) Continuation of application No. 17/209,894, filed on Mar. 23, 2021, now Pat. No. 11,776,874.

(60) Provisional application No. 62/993,738, filed on Mar. 24, 2020.

(51) Int. Cl.
*H01L 23/40* (2006.01)
*H05K 3/10* (2006.01)
*H05K 7/20* (2006.01)

(52) U.S. Cl.
CPC ......... *H01L 23/4006* (2013.01); *H05K 3/107* (2013.01); *H05K 7/209* (2013.01); *H01L 2023/4062* (2013.01); *H01L 2023/4087* (2013.01)

(58) Field of Classification Search
CPC ............... H05K 7/2039; H05K 7/2049; H05K 7/20409–20418; H05K 7/20154; H05K 7/20509; H05K 7/209; H05K 1/0201–0203; H05K 3/107; H01L 23/367; H01L 23/40–4093; G06F 1/20
See application file for complete search history.

(56) References Cited

U.S. PATENT DOCUMENTS 3,007,088 A * 10/1961 Diebold ................ H01L 23/473
257/E23.098
3,491,271 A    1/1970 Eccles
3,571,663 A *  3/1971 Hungate ............. H01L 23/4006
361/717

(Continued)

FOREIGN PATENT DOCUMENTS

DE    1614977 A1    5/1971
DE    2351637 A1    4/1975

(Continued)

OTHER PUBLICATIONS

DE-2532347-A English Translation (Year: 1977).*

(Continued)

*Primary Examiner* — Amir A Jalali
(74) *Attorney, Agent, or Firm* — Banner & Witcoff, Ltd.

(57) ABSTRACT

Systems, apparatuses, and methods are described for clamping a heat generating device such as a thyristor in place. The use of spring washers in various configurations is described. A spring washing washer may be used to apply force to a pad which in turn applies the force to a plate above a heat generating device. The plate above the heat generating device may apply downward pressure, which may force the heat generating device against a lower surface. Related systems, apparatuses, and methods are also described.

20 Claims, 5 Drawing Sheets

(56) References Cited

U.S. PATENT DOCUMENTS

| | | | |
|---|---|---|---|
| 3,573,574 A | | 4/1971 | Davis |
| 3,651,383 A | * | 3/1972 | Livezey .................. H01L 24/72 |
| | | | 257/688 |
| 3,812,557 A | | 5/1974 | Meyer |
| 4,097,036 A | * | 6/1978 | Henke ..................... H01L 23/32 |
| | | | 269/254 R |
| 4,159,483 A | * | 6/1979 | Bettin ..................... H01L 23/32 |
| | | | 257/722 |
| 4,224,663 A | | 9/1980 | Maiese et al. |
| 4,333,101 A | | 6/1982 | York |
| 4,636,917 A | * | 1/1987 | Jouanny ................ H01L 25/117 |
| | | | 361/709 |
| 4,642,671 A | * | 2/1987 | Rohsler .................. H01L 25/18 |
| | | | 257/688 |
| 5,528,159 A | | 6/1996 | Charlton et al. |
| 6,058,014 A | | 5/2000 | Choudhury et al. |
| 6,814,589 B1 | * | 11/2004 | Kuczynski ............. H05K 3/365 |
| | | | 439/86 |
| 7,538,436 B2 | | 5/2009 | Gunturi et al. |
| 9,984,953 B2 | | 5/2018 | Ekwall et al. |
| 2001/0044171 A1 | | 11/2001 | Mess |
| 2003/0029907 A1 | | 2/2003 | Neidich et al. |
| 2008/0165501 A1 | * | 7/2008 | Stewart ............... H01L 23/4006 |
| | | | 361/704 |
| 2009/0168358 A1 | | 7/2009 | Koike et al. |
| 2010/0059878 A1 | | 3/2010 | Crane et al. |
| 2016/0086873 A1 | | 3/2016 | Sano et al. |
| 2017/0196075 A1 | | 7/2017 | Barron et al. |
| 2018/0277508 A1 | | 9/2018 | Okuda et al. |
| 2020/0203255 A1 | | 6/2020 | Tschida et al. |

FOREIGN PATENT DOCUMENTS

| | | | | |
|---|---|---|---|---|
| DE | 2532347 A | * | 1/1977 | ......... H01L 23/4006 |
| DE | 2532347 A1 | | 1/1977 | |
| DE | 2841370 A1 | | 3/1980 | |
| DE | 4211426 C1 | | 6/1993 | |
| JP | S5921033 A | | 2/1984 | |
| WO | 2018050713 A1 | | 3/2018 | |

OTHER PUBLICATIONS

Jul. 26, 2021—European Search Report—EP 21164665.8.
"Semiconductor mounting clamps," ABB Product Catalog 2017.
"Specialists in Power Electronic Components and Assemblies," C & H Technology Inc.
"Power Assemblies Business Overview," Dynex Semiconductor Ltd, DYN-PA-19020-V2.
"Power Semiconductor Clamps for Disc (Puk) Semiconductors," C & H Technology, Apr. 30, 2015.
"Technical Information Bipolar Semiconductors," Infineon, AN2006-03, Application Note, V2.2, Mar. 2006.
"Extruded Heat Sinks for Power Semiconductors," Wakefield-Vette.
"Mechanical clamping of press-pack high power semiconductors," ABB, Application note 5SYA 2036-04, May 30, 2016.
B. Backlund & T. Schweizer, "Recommendations regarding mechanical clamping of Press Pack High Power Semiconductors—Product Information," ABB, Doc No. 5SYE2036-01, Nov. 2002.
G. Sites, "Proper Installation of SCR's will Extend Life," Ametek HDR Power Systems, Application Note 1019, Dec. 2012.
"Assembly instructions for clamp types V50 up to V100," Infineon, AN Jul. 2013, Jul. 22, 2013.
"Mounting Instructions for Hockey-PUK," Vishay Semiconductors, Application Note, Document 95544, Jun. 28, 2013.
"Clamping of Power Semiconductors," Dynex, Application Note 4839-4, Nov. 2015.

* cited by examiner

US 12,080,624 B2

APPARATUS AND METHOD FOR HOLDING A HEAT GENERATING DEVICE

CROSS REFERENCE TO RELATED APPLICATIONS

This application is a continuation of U.S. application Ser. No. 17/209,894, filed Mar. 23, 2021, which claims the benefit of U.S. Provisional Patent Application No. 62/993,738 filed Mar. 24, 2020. The contents of the above identified applications are incorporated herein by reference in their entireties.

BACKGROUND

Some power thyristors are disk shaped high-current silicon controlled rectifiers (SCR) used to regulate electrical power. There may be a need to effectively clamp a heat generating device (e.g., a thyristor) to heat dissipating elements for effective cooling. Misalignment of the heat generating device when clamped may result in a reduction of the transfer of heat from the thyristor to the heat sinks.

SUMMARY

The following summary presents a simplified summary of certain features. The summary is not an extensive overview and is not intended to identify key or critical elements.

Apparatuses, and methods are described for clamping a heat generating device, such as a thyristor in place. The use of spring washers in various configurations is described herein below. For example, spring washing may be used to apply force to a plate which in turn applies the force to a plate above the thyristor. The plate above the thyristor effectively applies downward pressure on the thyristor, thereby forcing the thyristor against a lower surface, which may be a heat sink. This may have the advantage of promoting heat transfer from the thyristor with a reduced chance of physically damaging (e.g., crushing) the thryristor.

These and other features and advantages are described in greater detail below.

BRIEF DESCRIPTION OF THE DRAWINGS

Some features are shown by way of example, and not by limitation, in the accompanying drawings. In the drawings, like numerals reference similar elements.

DETAILED DESCRIPTION

Figure 1:
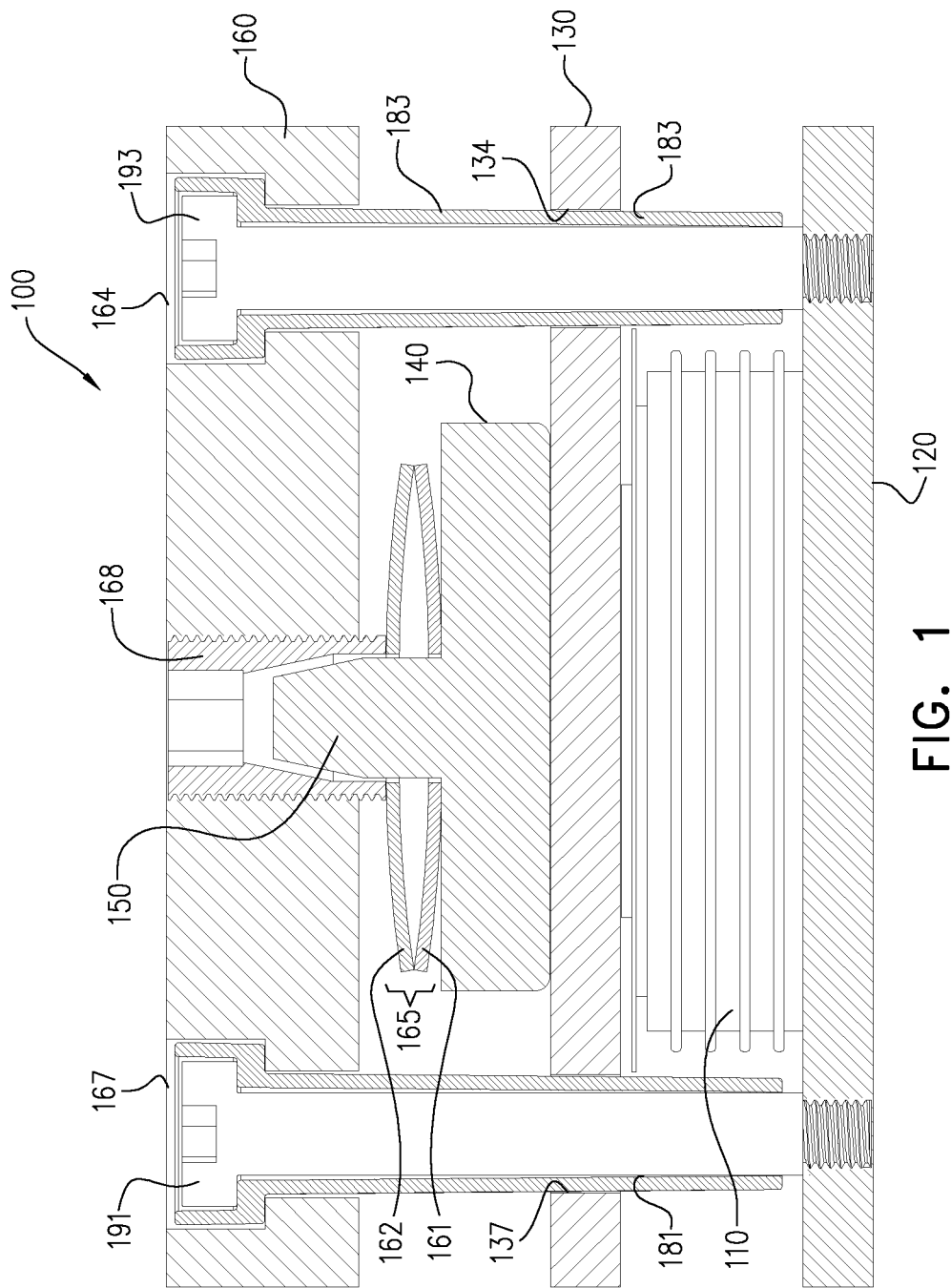
FIG. 1 shows a view of a first example apparatus for holding a heat generating device.

The accompanying drawings, which form a part hereof, show examples of the disclosure. It is to be understood that the examples shown in the drawings and/or discussed herein are non-exclusive and that there are other examples of how the disclosure may be practiced.

Figure 2:
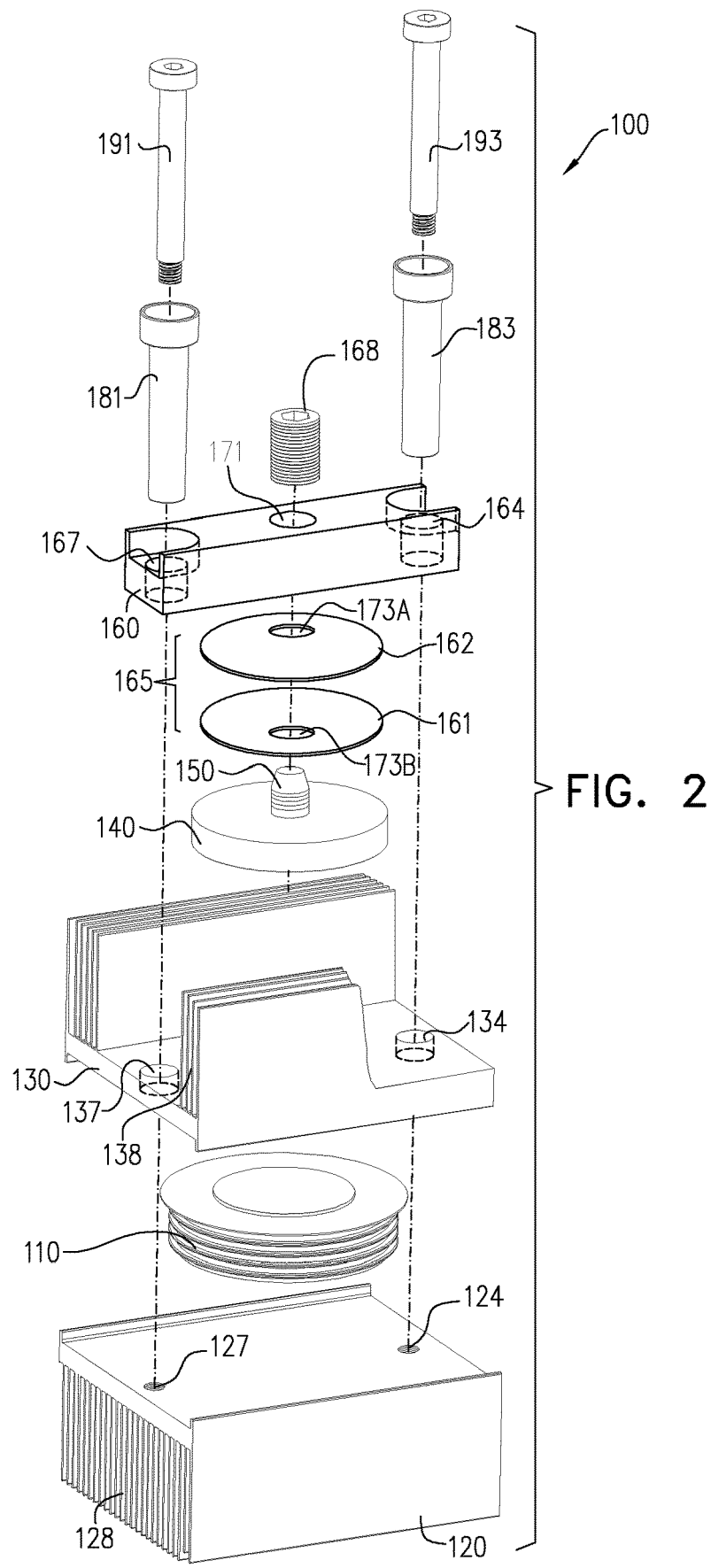
FIG. 2 shows an exploded view of the first example apparatus of FIG. 1.

Reference is now made to FIG. 1, which shows a view of a first example apparatus 100 for holding a heat generating device 110. Reference is also made to FIG. 2, which shows an exploded view of the first example apparatus of FIG. 1. The heat generating device 110 may, by way of example, comprise a thyristor, an insulated-gate bipolar transistor (IGBT), or other appropriate apparatus which generates heat during operation. A base plate 120 comprising a first heat sink may be disposed at a first side of the heat generating device 110 in the first example apparatus 100. The first heat sink may comprise fins 128 which may passively transfer heat generated during operation of the heat generating device 110. A holding plate 130, comprising a second heat sink, may be disposed at a second side of the heat generating device 110. The second heat sink may comprise fins 138 which may passively transfer heat generated during operation of the heat generating device 110. In the exemplary depiction of FIG. 1, the base plate 120 is depicted below the heat generating device 110, and the holding plate 130 is depicted above the heat generating device 110. The holding plate 130 has a first hole 137 and a second hole 134.

An electrically conductive pad 140 may be disposed on a side of the holding plate 130 opposite to the heat generating device 110. The pad 140 and the holding plate 130 are arranged with respect to each other such that when pressure is applied to the pad 140 (as will be described below), the pressure will (e.g., in turn) be applied in a substantially equal fashion over the surface of the holding plate 130 and then to the heat generating device 110. A central spindle 150 may be disposed substantially at the center of one side of the pad 140 (e.g., such that pressure applied to the central spindle 150 may press down on the pad 140, which may apply pressure to the holding plate 130). Pressure applied to the holding plate 130 may be substantially equally applied to all portions of the heat generating device 110. A clamping plate 160 may be situated above the pad 140, and may be arranged such that the central spindle 150 is substantially at the center of the clamping plate 160. The clamping plate 160 has a third hole 167 and a fourth hole 164. The first hole 137 may be aligned with the third hole 167. A first well 127 in the base plate 120 may be aligned with the first hole 137 and the third hole 167. The second hole 134 may be aligned with the fourth hole 164, and may be further aligned with a second hole 124.

Apparatus 100 may further include a first spring washer 161 comprising at least one concave lower spring washer having axial flexibility and a second spring washer 162 comprising at least one concave upper spring washer having axial flexibility. The first spring washer 161 and the second spring washer 162 may form an opposing pair of spring washers 165, wherein the concavity of the at least one upper spring washer 162 and concavity of the at least one lower spring washer 161 are opposed to one another such that the concavity of the at least one lower spring washer 161 is concave up with respect to the at least one upper spring washer 162. It is appreciated that the term "spring washer" refers to a type of washer that may also sometimes referred to as a "Belleville washer," a "conical washer," a "disc spring," or other similar terms. Spring washers typically may have axial flexibility, and a spring washer may provide axial force when deformed (e.g., when depressed from on the side of the 'apex', the spring washer may provide axial force downward, away from said apex). It is appreciated that the first spring washer 161 may comprise two, three, four or more first spring washers 161. Similarly, it is appreciated that the second spring washer 162 may comprise two, three, four or more second spring washers 162. The opposing pair of spring washers 165 may be designed and selected so as to allow a desired spring constant and deflection capacity.

A center bolt 168 passing through a central hole 171 in the clamping plate 160 may be axially aligned with and designed to engage threads of the central spindle 150. The center bolt 168 may be tightened around the central spindle 150, thereby applying downward pressure to the clamping plate 160. The central spindle 150 and the center bolt 168 may pass through a hole 173A, 173B in the opposing pair of spring washers 165. The hole 173A, 173B may be aligned with the center hole 171. The downward pressure applied by tightening the center bolt 168 on the clamping plate 160 may result in the opposing pair of spring washers 165 spreading, thereby lessening their concavity. The resulting downward from the pressure of the opposing pair of spring washers 165 may be thereupon substantially equally applied to the pad 140, which in turn may reflect the pressure downward into the holding plate 130, and further to the heat generating device 110.

Elements of the example apparatus 100 described until now may be constructed of any suitable material which conducts heat and/or electricity, such as, and without limiting the generality of the foregoing, aluminum, stainless steel, or titanium. For example, some elements described above may be of aluminum, while others may be stainless steel. Still others may be an alloy of appropriate materials.

A first member 181 may be disposed through the aligned third hole 167 and first hole 137 and above the first well 127. A first bolt 191 passes through the first member 181 and may be tightened into threading in the first well 127. A second member 183 may be disposed through the aligned fourth hole 164 and second hole 134 and above the second well 124. A second bolt 193 passes through the second member 183 and may be tightened into threading in the second well 124. The first member 181 and the second member 183 are typically comprises of a non-conducting material, for example, a non-conductive plastic. The first member 181 and the second member 183 may be hollow.

The center bolt 168 or the pad 140 comprise a recess, and respectively the pad 140 or the center bolt 168 comprises a protuberance, such as the central spindle 150 and wherein a fit tolerance between the recess and protuberance allows up to a 5 degree angle or a 10 degree angle between the center bolt 168 and the central spindle 150 when compressing the spring washers 165.

By way of an another example, the first hole 137 and the third hole 167 may be off-center or at an angle from one another. The second hole 134 and the fourth hole 164 off-center or at an angle from one another. In such a case, the clamping plate 160 may be arranged such that the central spindle 150 is substantially at the center of the clamping plate 160. The clamping plate 160 may be situated above the pad 140.

Figure 3:
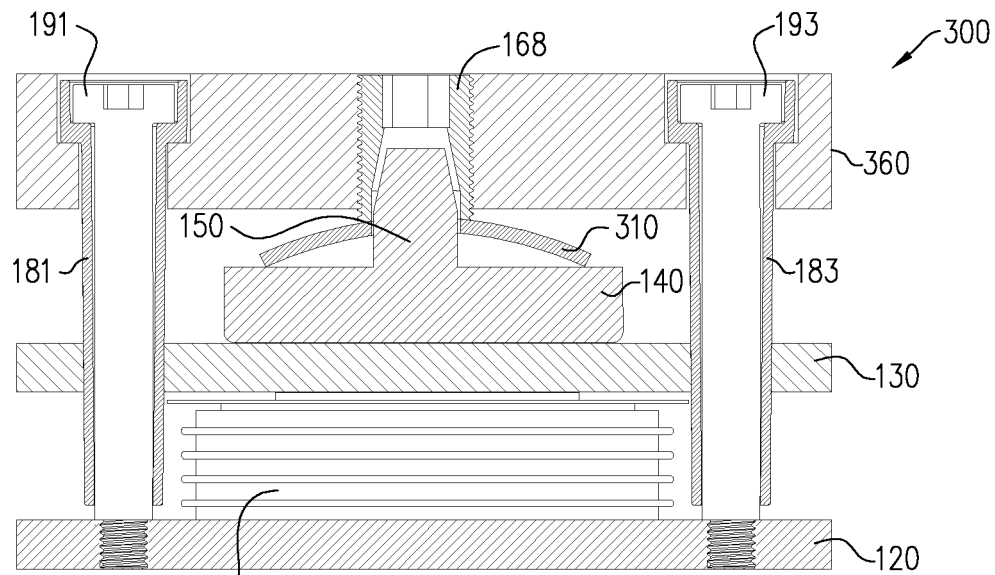
FIG. 3 shows a view of a second example apparatus for holding a heat generating device.

Reference is now made to FIG. 3, which shows a view of a second example apparatus 300 for holding a heat generating device 110. The second example apparatus 300 comprises a clamping plate 360 which may be the same or similar to the clamping plate 160. A single spring washer 310 corresponding to second spring washer 162 may be present (the first spring washer 161 of the opposing pair of spring washers 165 may be absent in the second example apparatus 300). As noted above with reference to second spring washer 162, single spring washer 310 may comprise a plurality of two, three, four or more single spring washers 310. The single spring washer 310, similar to the second spring washer 162, may be generally disposed so as to be concave down with respect to the clamping plate 160. Accordingly, when the center bolt 168 is tightened, the clamping plate 160 may move generally in the direction of the single spring washer 310, which may apply substantially equal pressure along the surface of the pad 140, as described above.

Figure 4:
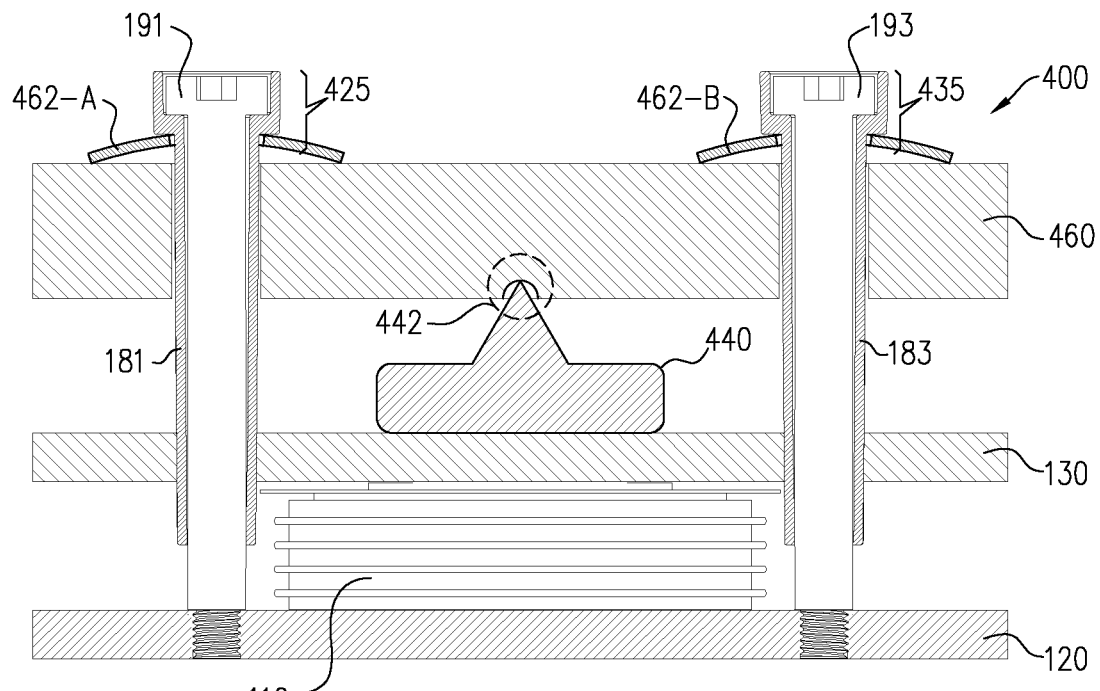
FIG. 4 shows a view of a third example apparatus for holding a heat generating device.

Reference is now made to FIG. 4, which shows a view of a third example of an apparatus 400 for holding a heat generating device 110. The third example apparatus 400 comprises a clamping plate 460 which may be the same or similar to the clamping plate 160. For example, the pad 140 and the central spindle 150 of FIG. 1 may have been replaced with a second pad 440. Second pad 440 may have a generally acute angle 442 at its point of intersection with the clamping plate 460. In the depicted third example apparatus 400, first spring washer 462-A may be disposed beneath a head 425 of the first member 181 and the first bolt 191. As discussed above with reference to second spring washer 162, first spring washer 462-A may comprise a plurality of two, three, four or more first spring washers 462-A. A second spring washer 462-B is disposed beneath a head 435 of a second member 183 and a bolt 193. As the bolt 191 and the bolt 193 are tightened, then the first spring washer 462-A and the second spring washer 462-B may be flattened, and may correspondingly apply pressure to the clamping plate 460. Pressure applied to the clamping plate may be transmitted down into the generally acute angle 442 at the point of intersection between the clamping plate 460 and second pad 440. As the second pad 440 is pressed down, it may apply pressure to the holding plate 130.

Figure 5:
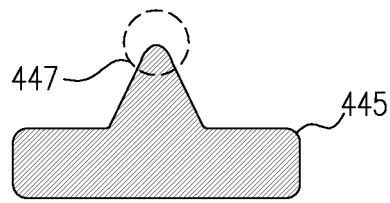
FIG. 5 shows an alternative design of the alternative pad of FIG. 4.

Reference is now made to FIG. 5, which shows an example (e.g., alternative) design 445 of the second pad 440 of FIG. 4. A rounded tip 447 may provide the point of intersection with the clamping plate 460 (for example, without having a generally acute angle 442 at the point of intersection with the clamping plate 460). In another example, clamping plate 460 may be constructed of a flexible material (e.g., having a non-zero spring coefficient). In such a case, the various spring washers, such as spring washers 161, 162, 310, 462-A, and 462-B might be absent from the third example apparatus 400, and replaced with a springy plate (e.g., a springy clamping plate 460). In such a design, as may be in the third example apparatus 400, the center bolt 168 (FIG. 1) may not be present.

One or more of the, the various spring washers, such as spring washers 161, 162, 310, 462-A, and 462-B may provide haptic, audible or tactile feedback when the spring washer (such as one of spring washer 161, spring washer 162, spring washer 310, spring washer 462-A or spring washer 462-B) is tightened.

Figure 6:
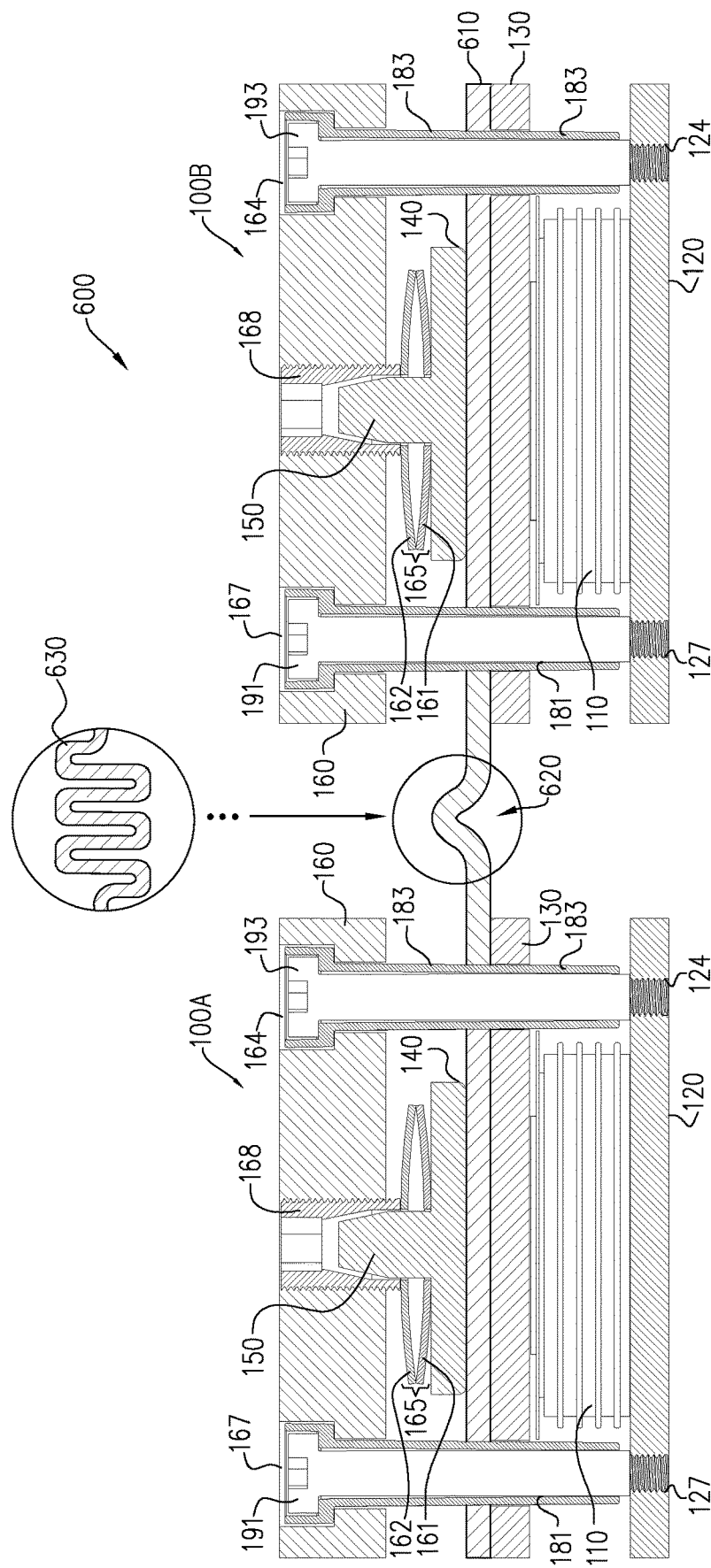
FIG. 6 shows an example of how a pair of the heat generating devices of FIG. 1 may be used in a single apparatus.

Reference is now made to FIG. 6, which shows an example of how two heat generating devices 110 of FIG. 1 may be used in a single apparatus 600. A static switch may be designed to transfer power loads between input sources (e.g., substantially instantaneously), which may improve reliability of backup power systems. When loads connected to a first power source (e.g., power grid, a transformer, and/or an uninterruptable power supply (UPS)) require too much power, a controller configured to control the static switch may switch the load to be connected to an alternative power source with minimal (e.g., no perceptible) interruption to the load. A pair of heat generating devices 110 (e.g., thyristors) may be used in designing such an apparatus 600 (e.g., a static switch). In such a case, two instances, such as 100A and 100B, of the apparatus 100 described above (e.g., in FIG. 1) may be used to hold the two heat generating devices 110 of FIG. 1. A first thryistor may connect the load to a first power source, such as a power grid, and a second thyristor may connect the load to a second power source, such as a device which stores and provides power (e.g., a battery or a fly wheel). An additional conducting layer 610 may be added, e.g., above each holding plate 130 of the respective apparatus 100. The additional conducting layer 610 may serve to connect (e.g., mechanically and/or electrically) each of the two of the apparatuses 100. (E.g., to provide mechanical to the additional conducting layer 610) an angle 620 may be introduced into the additional conducting layer 610. Additional flexibility may be added into the additional conducting layer 610, such as by providing a plurality of angles 630, and/or by enabling the angles to be disposed on both sides of (e.g., above and below) the additional conducting layer 610.

Figure 7:
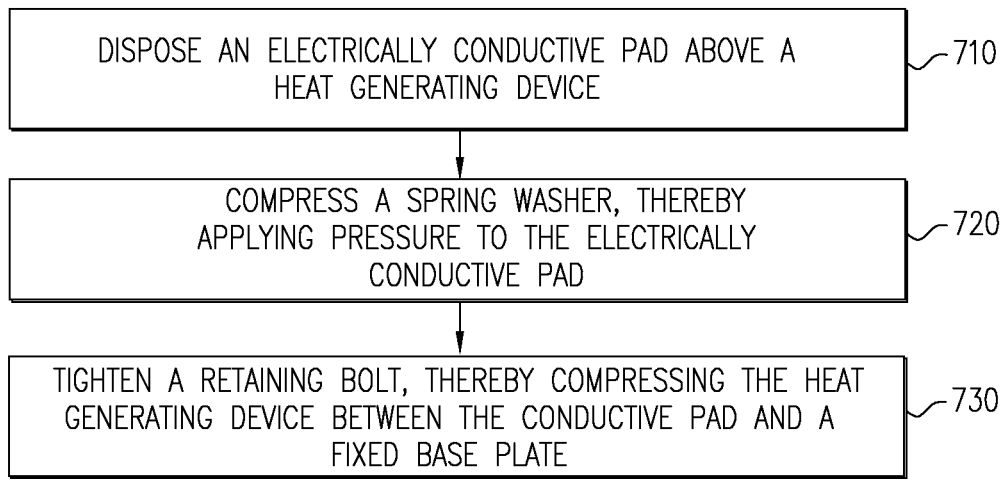
FIG. 7 is a flowchart of a method for implementing the apparatus of FIG. 1.

Reference is now made to FIG. 7, which is a flowchart of a method for implementing the apparatus of FIG. 1. In step 710 an electrically conductive pad, which may be the same or similar to electrically conductive pad 140, may be disposed above a heat generating device, which may be the same as, or similar to, the heat generating device 110. In step 720, a spring washer, which may be the same as or similar to such as spring washers 161, 162, 310, 462-A, and 462-B, may be compressed, thereby applying pressure to the electrically conductive pad, which may be the same or similar to electrically conductive pad 140. In step 730 a retaining bolt, such as, or similar to center bolt 168, may be tightened, thereby compressing the heat generating device between the conductive pad and a fixed base plate, which may be the same as or similar to base plate 120.

Figure 8:
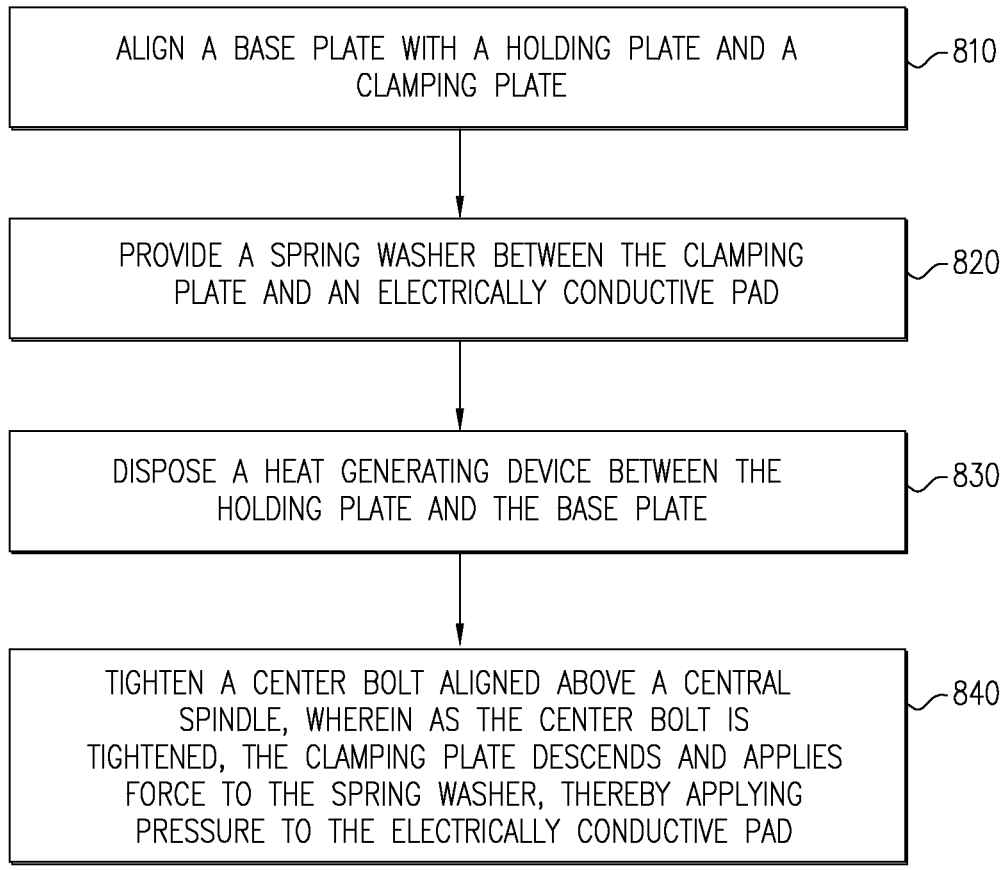
FIG. 8 is a flowchart of a method for implementing the apparatus of FIG. 1.

Reference is now made to FIG. 8 is a flowchart of a method for implementing the apparatus of FIG. 1. In step 810, a base plate, which may be the same as or similar to base plate 120, may be aligned with a holding plate, which may be the same as or similar to the holding plate 130, and a clamping plate, which may be the same as or similar to one or both of the clamping plate 160 or clamping plate 460. In step 820, a spring washer, which may be the same as or similar to any of spring washers 161, 162, 310, 462-A and, 462-B, may be provided between the clamping plate and an electrically conductive pad, which may be the same as or similar to electrically conductive pad 140. In step 830 a heat generating device, which may be the same as or similar to the heat generating device 110 may be disposed between the holding plate and the base plate. In step 840 a center bolt, such as or similar to center bolt 168, aligned above a central spindle may be tightened, whereupon the clamping plate descends and applies force to the spring washer, thereby applying pressure to the electrically conductive pad.

The skilled person will appreciate that inventive aspects disclosed herein include a method or apparatus as in any of the following clauses:

Clauses

1. An apparatus comprising:
    a base plate comprising a first heat sink;
    a holding plate comprising a second heat sink, wherein the holding plate comprises a first hole and a second hole;
    a clamping plate, comprising:
        a third hole aligned with the first hole;
        a fourth hole aligned with the second hole; and
        a fifth hole disposed intermediate to the third hole and the fourth hole;
    a first member, wherein the first member passes through the first hole into the third hole and further into the base plate;
    a second member, wherein the first member and the second member interconnect the clamping plate and the holding plate, wherein the first member and the second member descend into the base plate, and wherein the second member passes through the second hole into the fourth hole and further into the base plate;
    a plurality of spring washers comprising at least one concave upper spring washer and at least one concave lower spring washer, wherein a concavity of the at least one upper spring washer and a concavity of the at least one lower spring washer are opposed to one another, and wherein the concavity of the at least one upper spring washer is concave down with respect to the at least one lower spring washer, wherein the concavity of the at least one lower spring washer is concave up with respect to the at least one upper spring washer, and wherein the clamping plate is disposed above the plurality of spring washers; and
    a threaded fastener passing through the fifth hole, wherein when the threaded fastener is tightened such that the threaded fastener applies pressure to the at least one upper spring washer to spread the at least one upper spring washer, wherein spreading the at least one upper spring washer applies pressure to the at least one lower spring washer;
    a pad disposed between the plurality of spring washers and the holding plate; and
    a heat generating device clamped between the base plate and the holding plate such that heat from the heat generating device is dissipated to the base plate and the holding plate.
2. The apparatus according to clause 1, wherein the heat generating device comprises a thyristor.
3. The apparatus according to clause 2, wherein the thyristor comprises a disk shaped thyristor.
4. The apparatus according to any one of clauses 1 to 3, wherein the first member comprises a cylindrical member, or wherein the second member comprises a cylindrical member.
5. The apparatus according to any one of clauses 1 to 4, wherein the threaded fastener or the pad comprise a recess, and respectively the pad or the threaded fastener comprises a protuberance, and wherein a fit tolerance between the recess and protuberance allows up to a 5 degree angle when compressing the spring washers.
6. The apparatus according to any one of clauses 1 to 5, wherein a first bolt is disposed in the first member.
7. The apparatus according to any one of clauses 1 to 6, wherein a second bolt is disposed in the second member.
8. An apparatus comprising two of the apparatuses of any one of clauses 1 to 7 connected with an additional conducting layer, wherein the additional conducting layer is disposed above a first holding plate of a first one of the two of the apparatuses of clause 1 and a second holding plate of a second one of the two of the apparatuses of clause 1.
9. An apparatus comprising:
    a base plate comprising a first heat sink;
    a holding plate comprising a second heat sink, wherein the holding plate comprises a first hole and a second hole;
    a pad disposed above the holding plate;

a clamping plate comprising:
  a third hole aligned with the first hole;
  a fourth hole aligned with the second hole; and
  a fifth hole disposed intermediate to the third hole and the fourth hole;
a first member, wherein the first member passes through the first hole into the third hole and further into the base plate;
a second member, wherein the first member and the second member interconnect the clamping plate and the holding plate, wherein the first member and the second member descend into the base plate, and wherein the second member passes through the second hole into the fourth hole and further into the base plate;
at least one spring washer comprising a concave upper spring washer, wherein concavity of the upper spring washer is concave down with respect to the clamping plate and concave up with respect to the pad, and wherein the at least one spring washer is configured such that a pressure applied to the at least one spring washer is applied to the pad;
a threaded fastener passing through the fifth hole such that the threaded fastener applies pressure to the spring washer; and
a heat generating device clamped between the base plate and the holding plate such that heat from the heat generating device is dissipated to the base plate and the holding plate.

10. The apparatus according to clause 9, wherein the heat generating device comprises a thyristor.

11. The apparatus according to clause 10, wherein the thyristor comprises a disk shaped thyristor.

12. The apparatus according to any one of clauses 9 to 11, wherein the first member is hollow and comprises a cylindrical member.

13. The apparatus according to any one of clauses 9 to 12, wherein the second member is hollow and comprises a cylindrical member.

14. The apparatus according to any one of clauses 9 to 13, wherein the apparatus comprises a first insulating member extending through the first hole and the third hole.

15. The apparatus according to clause 14, wherein the apparatus comprises a first bolt disposed in the first insulating member and extending into the base plate.

16. The apparatus according to any one of clauses 9 to 15, wherein the apparatus comprises a second insulating member extending through the second hole and the fourth hole.

17. The apparatus according to clause 16, wherein the apparatus comprises a second bolt disposed in the second insulating member and extending into the base plate.

18. An apparatus comprising two of the apparatuses of any one of clauses 9 to 17 connected with an additional conducting layer, wherein the additional conducting layer is disposed above a first holding plate of a first one of the two of the apparatuses of any one of clauses 9 to 17 and a second holding plate of a second one of the two of the apparatuses of any one of clauses 9 to 17.

19. The apparatus according to any one of clauses 9 to 18, wherein the threaded fastener or the pad comprise a recess, and respectively the pad or the threaded fastener comprises a protuberance, and wherein a fit tolerance between the recess and protuberance allows up to a 5 degree angle when compressing the spring washers.

20. An apparatus comprising:
  a base plate comprising a first heat sink;
  a holding plate comprising a second heat sink, wherein the holding plate comprises a first hole and a second hole;
  a pad disposed above the holding plate;
  a clamping plate comprising:
    a third hole aligned with the first hole;
    a fourth hole, aligned with the second hole; and
    a fifth hole disposed intermediate to the third hole and the fourth hole;
  a first hollow member, wherein the first hollow member passes through the first hole into the third hole and further into the base plate;
  a second hollow member, wherein the first hollow member and the second hollow member interconnect the clamping plate and the holding plate, wherein the first hollow member and the second hollow member descend into the base plate, and wherein the second hollow member passes through the second hole into the fourth hole and further into the base plate;
  a first spring washer disposed beneath a head of the first hollow member and concave down with respect to the head of the first hollow member;
  a second spring washer disposed beneath a head of the second hollow member and concave down with respect to the head of the second hollow member, wherein the first spring washer and the second spring washer apply pressure to the clamping plate such that the clamping plate applies pressure to an interface point of the pad,
  a threaded fastener passing through the fifth hole such that the threaded fastener applies pressure to at least one of the first spring washer and the second spring washer; and a heat generating device clamped between the base plate and the holding plate such that heat from the heat generating device is dissipated to the base plate and the holding plate.

21. The apparatus according to clause 20, wherein the heat generating device comprises a thyristor.

22. The apparatus according to clause 21, wherein the thyristor comprises a disk shaped thyristor.

23. The apparatus according to any one of clauses 20 to 22, wherein the first hollow member comprises a cylindrical member.

24. The apparatus according to any one of clauses 20 to 23, wherein the second hollow member comprises a cylindrical member.

25. The apparatus according to any one of clauses 20 to 24, wherein the apparatus comprises a first bolt disposed in the first hollow member and extending into the base plate.

26. The apparatus according to any one of clauses 20 to 25, wherein the apparatus comprises a second bolt disposed in the second hollow member and extending into the base plate.

27. An apparatus comprising two of the apparatuses of any one of clauses 19 to 26 connected with an additional conducting layer, wherein the additional conducting layer is disposed above a first holding plate of a first one of the two of the apparatuses of any one of clauses 19 to 25 and a second holding plate of a second one of the two of the apparatuses of any one of clauses 19 to 25.

28. The apparatus according to any one of clauses 20 to 27, wherein the threaded fastener or the pad comprise a recess, and respectively the pad or the threaded fastener comprises a protuberance, and wherein a fit tolerance between the recess and protuberance allows up to a 5 degree angle when compressing the spring washers.

29. A method comprising:
   disposing an electrically conductive pad above a heat generating device;
   compressing a spring washer, thereby applying pressure to the electrically conductive pad;
   tightening a retaining bolt, thereby compressing the heat generating device between the conductive pad and a fixed base plate.

30. The method according to clause 29 wherein the heat generating device comprises a thyristor.

31. The method of clause 30 wherein the thyristor comprises a disk shaped thyristor.

32. The method of clause 29 wherein the heat generating device comprises an insulated-gate bipolar transistor (IGBT).

33. The method of clause 29 wherein the spring washer is compressed by a clamping plate.

34. The method according to clause 29 wherein the spring washer comprises an opposing pair of spring washers.

35. The method of clause 33 wherein the clamping plate is aligned with the base plate and with the holding plate.

36. The method of clause 34 wherein the aligning comprises:
   inserting a first bolt through a first hole in the clamping plate, a second hole in the holding plate and a third hole in the base plate; and
   inserting a second bolt through a fourth hole in the clamping plate, a fifth hole in the holding plate and a sixth hole in the base plate.

37. The method according to clause 35 wherein the first bolt is inserted into a cylindrical member.

38. The method according to clause 35 wherein the second bolt is inserted into a cylindrical member.

39. The method according to clause 35 wherein the third hole comprises a threaded hole, the first bolt comprises a threaded bolt, and inserting the first bolt in the third hole comprises screwing the thread of the first bolt into the third hole.

40. The method according to clause 36 wherein the sixth hole comprises a threaded hole, the second bolt comprises a threaded bolt, and inserting the second bolt in the sixth hole comprises screwing the thread of the second bolt into the sixth hole.

41. The method according to clause 29 wherein the heat generating device comprises a holding plate.

42. The method according to clause 29 wherein the base plate is disposed beneath the electrically conductive pad.

43. The apparatus according to any one of clauses 29 to 42, wherein the threaded fastener or the pad comprise a recess, and respectively the pad or the threaded fastener comprises a protuberance, and wherein a fit tolerance between the recess and protuberance allows up to a 5 degree angle when compressing the spring washers.

44. An apparatus comprising:
   an electrically conductive pad disposed above a heat generating device;
   a spring washer, configured to be compressed, wherein compressing the spring washer applies pressure to the electrically conductive pad;
   a retaining bolt configured to be tightened, wherein tightening the retaining bolt compresses the heat generating device between the conductive pad and a fixed base plate.

45. The apparatus of clause 44 wherein the heat generating device comprises one of a thyristor or an insulated-gate bipolar transistor (IGBT).

46. The apparatus of clause 44 wherein the spring washer is compressed by a clamping plate.

47. The apparatus of clause 44 wherein the spring washer comprises an opposing pair of spring washers.

48. The apparatus of clause 44 wherein the clamping plate is aligned with the base plate and with the holding plate.

49. The apparatus of clause 44 wherein, to align the clamping plate, the clamping plate is aligned with the base plate and with the holding plate:
   a first bolt is inserted through a first hole in the clamping plate, a second hole in the holding plate and a third hole in the base plate; and
   a second bolt is inserted through a fourth hole in the clamping plate, a fifth hole in the holding plate and a sixth hole in the base plate.

50. The apparatus of clause 44 wherein the first bolt is inserted into a cylindrical member and the second bolt is inserted into a cylindrical member.

51. The apparatus of clause 44 wherein the wherein the third hole comprises a threaded hole, the first bolt comprises a threaded bolt, and the thread of the first bolt is screwed into the third hole in order to insert the first bolt into the third hole; and
   wherein the sixth hole comprises a threaded hole, the second bolt comprises a threaded bolt, and the thread of the second bolt is screwed into the sixth hole in order to insert the second bolt into the sixth hole.

52. The apparatus of clause 44 wherein the heat generating device comprises a holding plate.

53. The apparatus of clause 44 wherein the base plate is disposed beneath the electrically conductive pad.

54. The apparatus according to any one of clauses 44 to 53, wherein the threaded fastener or the pad comprise a recess, and respectively the pad or the threaded fastener comprises a protuberance, and wherein a fit tolerance between the recess and protuberance allows up to a 5 degree angle when compressing the spring washers.

55. A method comprising:
   aligning a base plate with a holding plate and a clamping plate;
   providing a spring washer between the clamping plate and an electrically conductive pad;
   disposing a heat generating device between the holding plate and the base plate;
   tightening a center bolt aligned above a central spindle, wherein as the center bolt is tightened, the clamping plate descends and applies force to the spring washer, thereby applying pressure to the electrically conductive pad.

56. The method of claim 55 wherein the heat generating device comprises a thyristor.

57. The method of claim 56 wherein the thyristor comprises a disk shaped thyristor.

58. The method of claim 55 wherein the heat generating device comprises an insulated-gate bipolar transistor (IGBT).

59. The method of claim 55 wherein the aligning comprises:
inserting a first bolt through a first hole in the clamping plate, a second hole in the holding plate and a third hole in the base plate; and
inserting a second bolt through a fourth hole in the clamping plate, a fifth hole in the holding plate and a sixth hole in the base plate.

60. The method according to claim 58 wherein the first bolt is inserted into a cylindrical member.

61. The method according to claim 58 wherein the second bolt is inserted into a cylindrical member.

62. The method according to claim 58 wherein the third hole comprises a threaded hole, the first bolt comprises a threaded bolt, and inserting the first bolt in the third hole comprises screwing the thread of the first bolt into the third hole.

63. The method according to claim 58 wherein the sixth hole comprises a threaded hole, the second bolt comprises a threaded bolt, and inserting the second bolt in the sixth hole comprises screwing the thread of the second bolt into the sixth hole.

64. The method according to claim 55 wherein the wherein the spring washer comprises an opposing pair of spring washers.

65. The method according to claim 55 and further comprising the spring washer providing haptic, audible, or tactile feedback when tightening.

66. The apparatus according to any one of clauses 54 to 64, wherein the threaded fastener or the pad comprise a recess, and respectively the pad or the threaded fastener comprises a protuberance, and wherein a fit tolerance between the recess and protuberance allows up to a 5 degree angle when compressing the spring washers.

67. An apparatus comprising:
a base plate aligned with a holding plate and a clamping plate;
a spring washer disposed between the clamping plate and an electrically conductive pad;
a heat generating device disposed between the holding plate and the base plate;
a center bolt aligned above a central spindle, wherein as the center bolt is tightened, the clamping plate descends and applies force to the spring washer, thereby applying pressure to the electrically conductive pad.

68. The apparatus of clause 62 wherein the heat generating device comprises a thyristor.

69. The apparatus of clause 63 wherein the thyristor comprises a disk shaped thyristor.

70. The apparatus of clause 62 wherein the heat generating device comprises an insulated-gate bipolar transistor (IGBT).

71. The apparatus of clause 62 wherein the base plate aligned with a holding plate and a clamping plate comprises:
a first bolt inserted through a first hole in the clamping plate, a second hole in the holding plate and a third hole in the base plate; and
a second bolt inserted through a fourth hole in the clamping plate, a fifth hole in the holding plate and a sixth hole in the base plate.

72. The apparatus according to clause 65 wherein the first bolt is inserted into a cylindrical member.

73. The apparatus according to clause 65 wherein the second bolt is inserted into a cylindrical member.

74. The apparatus according to clause 65 wherein the third hole comprises a threaded hole, the first bolt comprises a threaded bolt, and the first bolt is screwed into the third hole.

75. The apparatus according to clause 65 wherein the sixth hole comprises a threaded hole, the second bolt comprises a threaded bolt, and the second bolt is screwed into the sixth hole.

76. The apparatus according to clause 62 wherein the wherein the spring washer comprises an opposing pair of spring washers.

77. The apparatus according to clause 62 wherein the spring washer provides haptic, audible, or tactile feedback when tightening.

78. The apparatus according to any one of clauses 67 to 77, wherein the threaded fastener or the pad comprise a recess, and respectively the pad or the threaded fastener comprises a protuberance, and wherein a fit tolerance between the recess and protuberance allows up to a 5 degree angle when compressing the spring washers.

Although examples are described above, features and/or steps of those examples may be combined, divided, omitted, rearranged, revised, and/or augmented in any desired manner. Various alterations, modifications, and improvements will readily occur to those skilled in the art. Such alterations, modifications, and improvements are intended to be part of this description, though not expressly stated herein, and are intended to be within the spirit and scope of the disclosure. Accordingly, the foregoing description is by way of example only, and is not limiting.

The invention claimed is:

1. An apparatus comprising:
a holding plate configured to contact a heat generating device;
a clamping plate;
a pad disposed between the holding plate and the clamping plate, the pad comprising a convex portion, wherein the convex portion faces the clamping plate and is configured to provide a point of intersection between the pad and the clamping plate;
a first member associated with a first spring washer and a second member associated with a second spring washer,
wherein compressing the first spring washer and the second spring washer is configured to apply pressure to the clamping plate, wherein said pressure is transmitted into the point of intersection, thereby pressing the pad and applying pressure to the holding plate;
a fixed base plate, wherein the first member and the second member pass into the fixed base plate, and wherein compressing the first spring washer and the second spring washer is configured to compress the heat generating device between the pad and the holding plate from one side and the fixed base plate from another side,
wherein:
the holding plate comprises a first hole and a second hole;
the clamping plate comprises a third hole and a fourth hole;
the fixed base plate comprises a first threaded portion and a second threaded portion;
the first member passes through the first hole and the third hole, and the second member passes through the second hole and the fourth hole; and
a first bolt comprising a first threaded bolt is disposed in the first member and the first threaded portion, and a second bolt comprising a second threaded bolt is disposed in the second member and the second threaded portion.

2. The apparatus of claim 1, wherein the fixed base plate, the holding plate or both comprise a heat sink.

3. The apparatus of claim 1, wherein the first spring washer is disposed beneath a head of the first member and the first bolt, and the second spring washer is disposed beneath a head of the second member and the second bolt.

4. The apparatus of claim 3, wherein compressing the first spring washer and the second spring washer comprises tightening the first bolt and the second bolt and screwing a thread of the first bolt into the first threaded portion and screwing a thread of the second bolt into the second threaded portion.

5. The apparatus of claim 1, wherein each of the first spring washer and the second spring washer comprises an opposing pair of spring washers.

6. The apparatus of claim 1, wherein the convex portion comprises a generally acute angle or a rounded tip at the point of intersection.

7. The apparatus of claim 1, wherein the pad is an electrically conductive pad.

8. The apparatus of claim 1, wherein the heat generating device comprises one of a thyristor or an insulated-gate bipolar transistor (IGBT).

9. The apparatus of claim 1, wherein the first spring washer and the second spring washer each comprise a concave portion, and each concave portion faces the clamping plate.

10. A method comprising:
disposing a pad between a holding plate which is configured to contact a heat generating device, and a clamping plate, the pad comprising a convex portion, which faces the clamping plate and is configured to provide a point of intersection between the pad and the clamping plate; and
compressing a first spring washer associated with a first member and the clamping plate, and a second spring washer associated with a second member and the clamping plate, to apply pressure to the clamping plate, wherein said pressure is transmitted into the point of intersection, thereby pressing the pad and applying pressure to the holding plate;
wherein:
the first member and the second member are associated with a fixed base plate, and wherein compressing the first spring washer and the second spring washer is configured to compress the heat generating device between the pad and the holding plate from one side and the fixed base plate from another side; and
the clamping plate is aligned with the fixed base plate and with the holding plate by:
passing the first member passing through a first hole in the clamping plate and a third hole in the holding plate;
passing the second member through a second hole in the clamping plate and a fourth hole in the holding plate;
inserting a first bolt through the first member and a first threaded portion in the fixed base plate; and
inserting a second bolt through the second member and a second threaded portion in the fixed base plate.

11. The method of claim 10, wherein each of the first spring washer and the second spring washer comprises an opposing pair of spring washers.

12. The method of claim 10, wherein inserting the first bolt in the first threaded portion comprises screwing a thread of the first bolt into the first threaded portion; and inserting the second bolt in the second threaded portion comprises screwing a thread of the second bolt into the second threaded portion.

13. The method of claim 10, wherein the fixed base plate, the holding plate or both comprise a heat sink.

14. The method of claim 10, wherein the convex portion comprises a generally acute angle or a rounded tip at the point of intersection.

15. The method of claim 10, wherein the pad is an electrically conductive pad.

16. The method of claim 10, wherein the heat generating device comprises one of a thyristor or an insulated-gate bipolar transistor (IGBT).

17. The method of claim 10, further comprising disposing the first spring washer beneath a head of the first member and the first bolt, and disposing the second spring washer beneath a head of the second member and the second bolt.

18. The method of claim 10, wherein the first spring washer and the second spring washer each comprise a concave portion, and disposing each concave portion facing the clamping plate.

19. A system comprising:
a heat generating device;
a holding plate configured to contact the heat generating device;
a clamping plate;
a pad disposed between the holding plate and the clamping plate, the pad comprising a convex portion, wherein the convex portion faces the clamping plate and is configured to provide a point of intersection between the pad and the clamping plate;
a first member associated with a first spring washer and a second member associated with a second spring washer,
wherein compressing the first spring washer and the second spring washer is configured to apply pressure to the clamping plate, wherein said pressure is transmitted into the point of intersection, thereby pressing the pad and applying pressure to the holding plate;
a fixed base plate, wherein the first member and the second member pass into the fixed base plate, and wherein compressing the first spring washer and the second spring washer is configured to compress the heat generating device between the pad and the holding plate from one side and the fixed base plate from another side,
wherein:
the holding plate comprises a first hole and a second hole;
the clamping plate comprises a third hole and a fourth hole;
the fixed base plate comprises a first threaded portion and a second threaded portion;
the first member passes through the first hole and the third hole, and the second member passes through the second hole and the fourth hole; and
a first bolt comprising a first threaded bolt is disposed in the first member and the first threaded portion, and a second bolt comprising a second threaded bolt is disposed in the second member and the second threaded portion.

20. The system of claim 19, wherein the heat generating device comprises one of a thyristor or an insulated-gate bipolar transistor (IGBT).

* * * * *